(12) United States Patent
Dennard et al.

(10) Patent No.: US 8,587,063 B2
(45) Date of Patent: Nov. 19, 2013

(54) HYBRID DOUBLE BOX BACK GATE SILICON-ON-INSULATOR WAFERS WITH ENHANCED MOBILITY CHANNELS

(75) Inventors: Robert H. Dennard, Yorktown Heights, NY (US); Qiqing C. Ouyang, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 790 days.

(21) Appl. No.: 12/613,574

(22) Filed: Nov. 6, 2009

(65) Prior Publication Data

US 2011/0108943 A1 May 12, 2011

(51) Int. Cl.
*H01L 29/78* (2006.01)

(52) U.S. Cl.
USPC .......................................................... 257/347

(58) Field of Classification Search
USPC ................... 257/347, E29.273; 438/281, 296
See application file for complete search history.

(56) References Cited

U.S. PATENT DOCUMENTS

| | | | |
|---|---|---|---|
| 5,374,564 A | 12/1994 | Bruel | |
| 5,882,987 A | 3/1999 | Srikrishnan | |
| 6,057,212 A | 5/2000 | Chan et al. | |
| 6,083,797 A | 7/2000 | Wong et al. | |
| 6,093,623 A | 7/2000 | Forbes | |
| 6,162,741 A | 12/2000 | Akasaka et al. | |
| 6,228,691 B1 | 5/2001 | Doyle | |
| 6,246,094 B1 | 6/2001 | Wong et al. | |
| 6,414,361 B2 | 7/2002 | Wong et al. | |
| 6,566,158 B2 | 5/2003 | Eriksen et al. | |
| 6,576,957 B2 | 6/2003 | Houston | |
| 6,580,128 B2 | 6/2003 | Ohkubo | |
| 6,849,518 B2 | 2/2005 | Parat et al. | |
| 7,008,857 B2 | 3/2006 | Ghyselen et al. | |
| 7,018,873 B2 | 3/2006 | Dennard et al. | |
| 7,102,166 B1 * | 9/2006 | Bryant et al. | 257/64 |
| 7,132,339 B2 | 11/2006 | Bryant et al. | |
| 7,235,812 B2 | 6/2007 | Chu et al. | |
| 7,323,370 B2 | 1/2008 | Furukawa | |
| 7,410,904 B2 | 8/2008 | Stasiak et al. | |

(Continued)

FOREIGN PATENT DOCUMENTS

WO 9520824 A1 3/1995
WO 2006001915 A2 1/2006

(Continued)

OTHER PUBLICATIONS

International Search Report; International Application No. PCT/US 09/67102; International Filing Date: Dec. 8, 2009; Date of mailing: Feb. 25, 2010; 3 pages.

(Continued)

*Primary Examiner* — Nathan Ha
(74) *Attorney, Agent, or Firm* — Cantor Colburn LLP; Vazken Alexanian

(57) ABSTRACT

A semiconductor wafer structure for integrated circuit devices includes a bulk substrate; a lower insulating layer formed on the bulk substrate; an electrically conductive back gate layer formed on the lower insulating layer; an upper insulating layer formed on the back gate layer; and a hybrid semiconductor-on-insulator layer formed on the upper insulating layer, the hybrid semiconductor-on-insulator layer comprising a first portion having a first crystal orientation and a second portion having a second crystal orientation.

24 Claims, 21 Drawing Sheets

(56) References Cited

U.S. PATENT DOCUMENTS

| | | | |
|---|---|---|---|
| 7,439,110 B2 * | 10/2008 | Cheng et al. | 438/150 |
| 7,453,123 B2 | 11/2008 | Dokumaci et al. | |
| 7,682,941 B2 * | 3/2010 | Anderson et al. | 438/478 |
| 7,732,287 B2 | 6/2010 | Fechner et al. | |
| 7,898,003 B2 * | 3/2011 | Cheng et al. | 257/192 |
| 8,016,941 B2 * | 9/2011 | Hierlemann et al. | 117/11 |
| 8,169,007 B2 * | 5/2012 | Anderson et al. | 257/270 |
| 8,193,032 B2 * | 6/2012 | Chen et al. | 438/105 |
| 8,193,616 B2 * | 6/2012 | Hamaguchi et al. | 257/627 |
| 2003/0186073 A1 | 10/2003 | Fitzgerald | |
| 2005/0067055 A1 | 3/2005 | Choe et al. | |
| 2005/0087804 A1 | 4/2005 | Furukawa | |
| 2005/0181612 A1 | 8/2005 | Brask et al. | |
| 2006/0057836 A1 | 3/2006 | Nagarajan et al. | |
| 2006/0172505 A1 | 8/2006 | Koester et al. | |
| 2006/0231873 A1 | 10/2006 | Anderson et al. | |
| 2006/0231893 A1 * | 10/2006 | Bernstein et al. | 257/347 |
| 2006/0284251 A1 | 12/2006 | Hsu et al. | |
| 2007/0034950 A1 | 2/2007 | Park et al. | |
| 2007/0040218 A1 * | 2/2007 | Haensch et al. | 257/347 |
| 2007/0122998 A1 | 5/2007 | Droes et al. | |
| 2007/0138533 A1 * | 6/2007 | Dennard et al. | 257/314 |
| 2007/0257317 A1 | 11/2007 | Fechner et al. | |
| 2007/0281441 A1 | 12/2007 | Dantz et al. | |
| 2008/0001183 A1 | 1/2008 | Kapoor | |
| 2008/0036000 A1 | 2/2008 | Anderson et al. | |
| 2008/0185644 A1 | 8/2008 | Anderson et al. | |
| 2009/0057746 A1 | 3/2009 | Sugll et al. | |
| 2009/0127591 A1 | 5/2009 | Moriwaka | |
| 2010/0176482 A1 | 7/2010 | Dennard et al. | |
| 2011/0284961 A1 * | 11/2011 | Botula et al. | 257/347 |

FOREIGN PATENT DOCUMENTS

| | | |
|---|---|---|
| WO | 2007030368 A2 | 3/2007 |
| WO | 2008148882 A2 | 12/2008 |
| WO | 2009128776 A1 | 10/2009 |
| WO | 2010080292 A1 | 7/2010 |

OTHER PUBLICATIONS

International Written Opinion; International Application No. PCT/US 09/67102; Date of mailing: Feb. 25, 2010; 7 pages.

U.S. Appl. No. 13/350,889; Non-Final Office Action; Date Filed: Jan. 16, 2012; Date Mailed: Jun. 7, 2012; pp. 1-17.

International Search Report; International Application No. PCT/EP2010/066715; International Filing Date: Nov. 3, 2010; Date of Mailing: Feb. 11, 2011.

International Search Report—Written Opinion; International Application No. PCT/EP2010/066715; International Filing Date: Nov. 3, 2010; Date of Mailing: Feb. 11, 2011.

AVCI, "Back-gate MOSFET for power-adaptive applications," Cornell University Ph.D. thesis, vol. 66014B of Dissertations Abstracts International, ISBN:0-542-10276-5; 2005, p. 2218.

J. B. Yau et al.; "FDSOI CMOS with Dual Backgate Control for Performance and Power Modulation;" IEEE; 2009; pp. 84-85.

S. Bedell et al.; "Mobility Scaling in Short-Channel Length Strained Ge-on-Insulator P-MOSFETs;" IEEE Electron Device Letters, vol. 29, No. 7, Jul. 2008; pp. 811-813.

T. Tezuka et al.; "Strained SOI/SGOI dual-channel CMOS technology based on the Ge condensation technique;" Semiconductor Science and Technology 22; 2007; pp. S93-S98.

R. Tsuchiya et al.; "Controllable Inverter Delay and Suppressing Vth Fluctuation Technology in Silicon on Thin Box Featuring Dual Back-Gate Bias Architecture;" IEEE; 2007; pp. 475-478.

U.S. Appl. No. 13/350,889; Final Office Action; Date Filed: Jan. 16, 2012; Date Mailed: Nov. 9, 2012; pp. 1-15.

Deutsches Patent-und Markenamt, DE Office Action; 11 2010004307.8, Sep. 20, 2012, pp. 1-6.

* cited by examiner

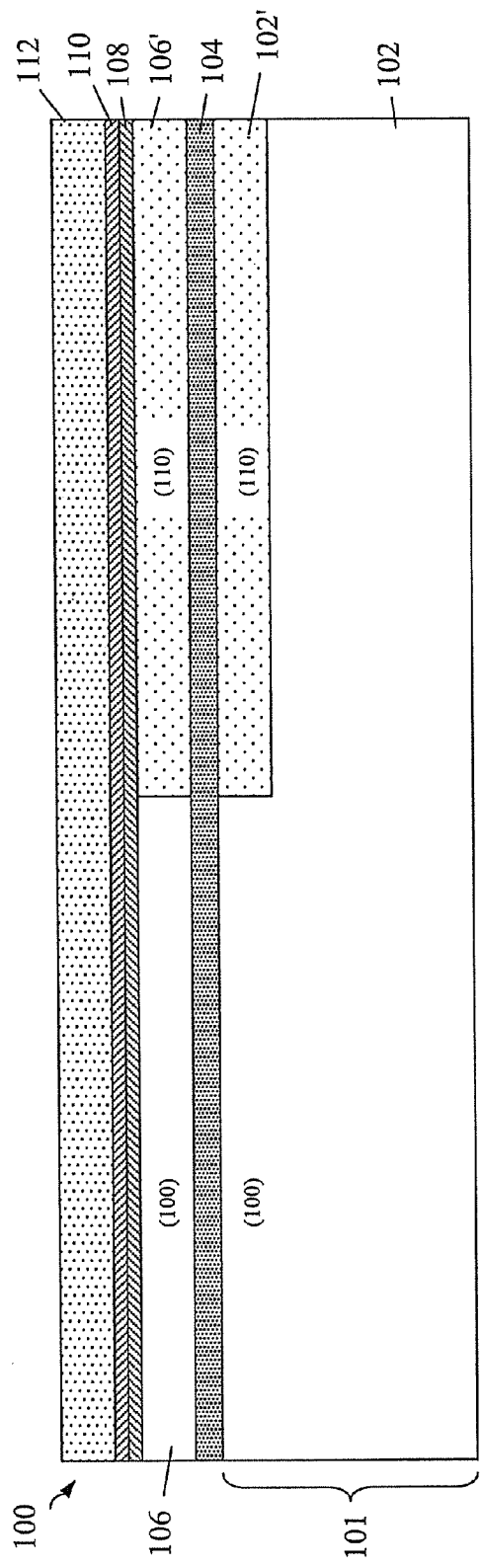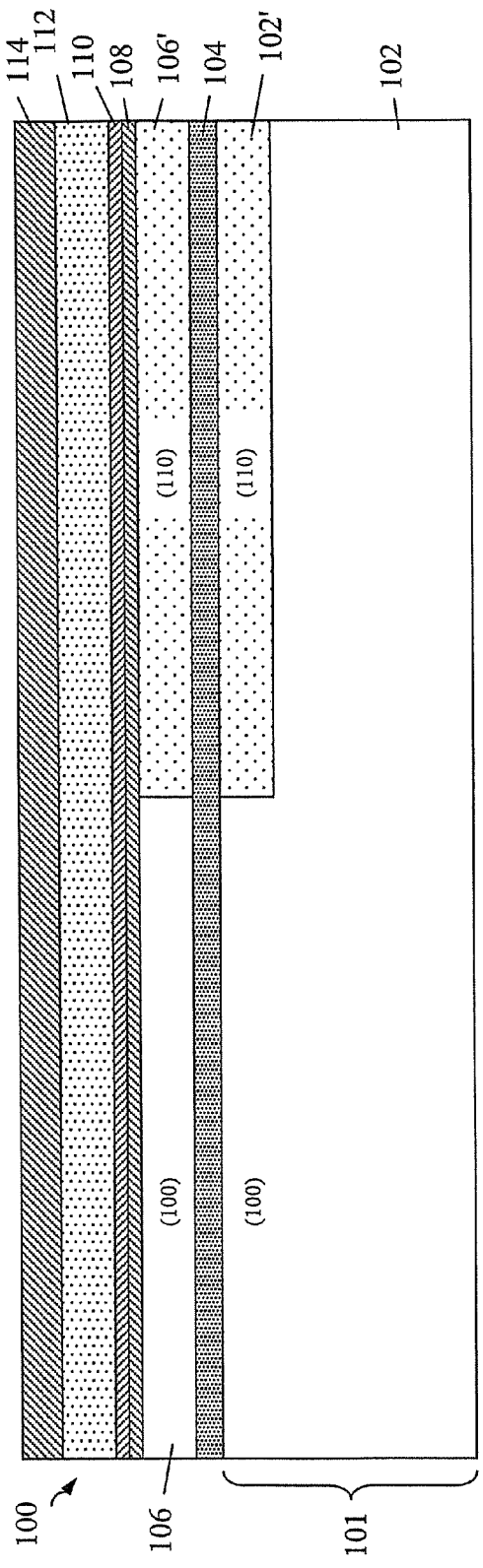

HYBRID DOUBLE BOX BACK GATE SILICON-ON-INSULATOR WAFERS WITH ENHANCED MOBILITY CHANNELS

BACKGROUND

The present invention relates generally to semiconductor device manufacturing techniques and, more particularly, to fabrication of hybrid double buried oxide (BOX), back gate (DBBG) extremely thin silicon-on-insulator (ETSOI) wafers with enhanced mobility channels.

Fully depleted transistor devices are essential for device scaling. Extremely thin SOI (ETSOI) complementary metal oxide semiconductor (CMOS) transistors with back gate controls have shown advantages with respect to reducing short channel effects (SCE), reducing threshold voltage (Vt) variability due to body doping fluctuations, and using the back gate voltage to adjust/tune the threshold. However, the drive current of such back gated ETSOI devices is limited due to relatively lower carrier mobility in such thin silicon (Si) regions. Although some stress techniques such as the application of stressed contact area (CA) liners may be applied in order to improve the carrier mobility, it is still difficult to form embedded SiGe in the source/drain areas due to the extremely thin Si layer.

SUMMARY

In an exemplary embodiment, a semiconductor wafer structure for integrated circuit devices includes a bulk substrate; a lower insulating layer formed on the bulk substrate; an electrically conductive back gate layer formed on the lower insulating layer; an upper insulating layer formed on the back gate layer; and a hybrid semiconductor-on-insulator layer formed on the upper insulating layer, the hybrid semiconductor-on-insulator layer comprising a first portion having a first crystal orientation and a second portion having a second crystal orientation.

In another embodiment, a method of forming a semiconductor wafer structure for integrated circuit devices includes forming a first substrate portion, the first substrate portion further comprising a hybrid bulk substrate having a first crystal orientation portion and a second crystal orientation portion, a sacrificial layer formed on the hybrid bulk substrate, a hybrid semiconductor layer formed on the sacrificial layer, a first insulating layer formed on the hybrid semiconductor layer, an electrically conductive layer formed over the first insulating layer, and a second insulating layer, suitable for bonding to another insulating layer, formed on the electrically conductive layer; forming a second substrate portion having a bulk substrate and a third insulating layer formed on the second bulk substrate; bonding the second substrate portion to the first substrate portion so as to define a bonding interface between the second and third insulating layers; separating the resulting bonded structure at a location within the hybrid bulk substrate or the sacrificial layer and removing any remaining portion of the hybrid bulk substrate; and removing any remaining portion of the sacrificial layer so as to define a hybrid double buried insulator back gate semiconductor-on-insulator wafer structure, wherein the first insulating layer comprises an upper insulating layer, the bonded second and third insulating layers together comprise a lower insulating layer, the hybrid semiconductor layer comprises a hybrid semiconductor-on-insulator layer having the first and second crystal orientation portions, the electrically conductive layer comprises a back gate layer, and the bulk substrate comprises a bulk substrate of the hybrid double buried insulator back gate semiconductor-on-insulator wafer structure.

In another embodiment, a method of forming a hybrid double buried oxide (BOX), back gate (DBBG) semiconductor-on-insulator (SOI) wafer structure for integrated circuit devices includes forming a first substrate portion, the first substrate portion further comprising a hybrid bulk silicon substrate having a (100) crystal orientation portion and a (110) crystal orientation portion, a sacrificial silicon germanium (SiGe) layer epitaxially grown on the hybrid bulk silicon substrate, a hybrid silicon layer grown on the sacrificial layer, the hybrid silicon layer also having a (100) crystal orientation portion and a (110) crystal orientation portion corresponding to the hybrid bulk silicon substrate, a first oxide layer thermally grown or deposited on the hybrid silicon layer, an etch stop layer deposited on the first oxide layer, an electrically conductive back gate layer formed on the etch stop layer, and a second oxide layer thermally grown or deposited on the back gate layer; forming a second substrate portion having a bulk silicon substrate and a third oxide layer thermally grown or deposited on the second bulk substrate; implanting a hydrogen species through the second oxide layer, the electrically conductive back gate layer, the etch stop layer, the first oxide layer and the silicon layer, stopping within or beyond the sacrificial SiGe layer; bonding the second substrate portion to the first substrate portion so as to define a bonding interface between the second and third oxide layers; performing a first annealing procedure to enhance oxide-to-oxide bonding between the second and third oxide layers; performing a second annealing procedure at a higher temperature than the first annealing procedure so as to create a front of connecting voids corresponding to a location of the hydrogen species; separating the bonded structure along the void front; and removing any remaining part of the hybrid bulk silicon substrate and the sacrificial SiGe layer on the hybrid silicon layer so as to define the hybrid DBBG SOI wafer structure, wherein the first oxide layer and the etch stop layer comprise an upper BOX, the bonded second and third oxide layers together comprise a lower BOX, the hybrid silicon layer comprises a hybrid SOI layer, the back gate layer is disposed between the upper BOX and the lower BOX, and the bulk silicon substrate comprises a bulk substrate of the hybrid DBBG SOI wafer structure.

BRIEF DESCRIPTION OF THE DRAWINGS

Referring to the exemplary drawings wherein like elements are numbered alike in the several Figures:

FIGS. 1-15 are various cross-sectional views illustrating a method of forming a hybrid, back gated, extremely thin silicon-on-insulator (ETSOI) wafer structure with enhanced mobility channels, in accordance with an embodiment of the invention, where in particular:

FIGS. 1 and 2 illustrate the formation of a first substrate portion used for the hybrid ETSOI structure;

FIG. 3 illustrates a hydrogen species implanted into a sacrificial silicon germanium (SiGe) layer of the first substrate portion;

FIG. 4 illustrates the formation of a second substrate portion used for the hybrid ETSOI structure;

FIG. 5 illustrates the bonding of the first substrate portion to the second substrate portion;

FIG. 6 illustrates an annealing procedure to form a fracture front in the sacrificial SiGe layer of the bonded structure;

FIG. 7 illustrates the removal of a top portion of the bonded structure following separation at the sacrificial SiGe layer;

FIG. 8 illustrates the remaining bottom portion of the bonded structure and remaining sacrificial SiGe layer following wafer separation;

FIG. 9 illustrates a resulting hybrid ETSOI wafer structure following removal of the remaining sacrificial SiGe layer and final bonding annealing procedure;

FIGS. 10-15 illustrate a subsequent self-aligned dual-depth shallow trench isolation process for the hybrid ETSOI wafer structure prior to front gate formation.

DETAILED DESCRIPTION

Figure 3:
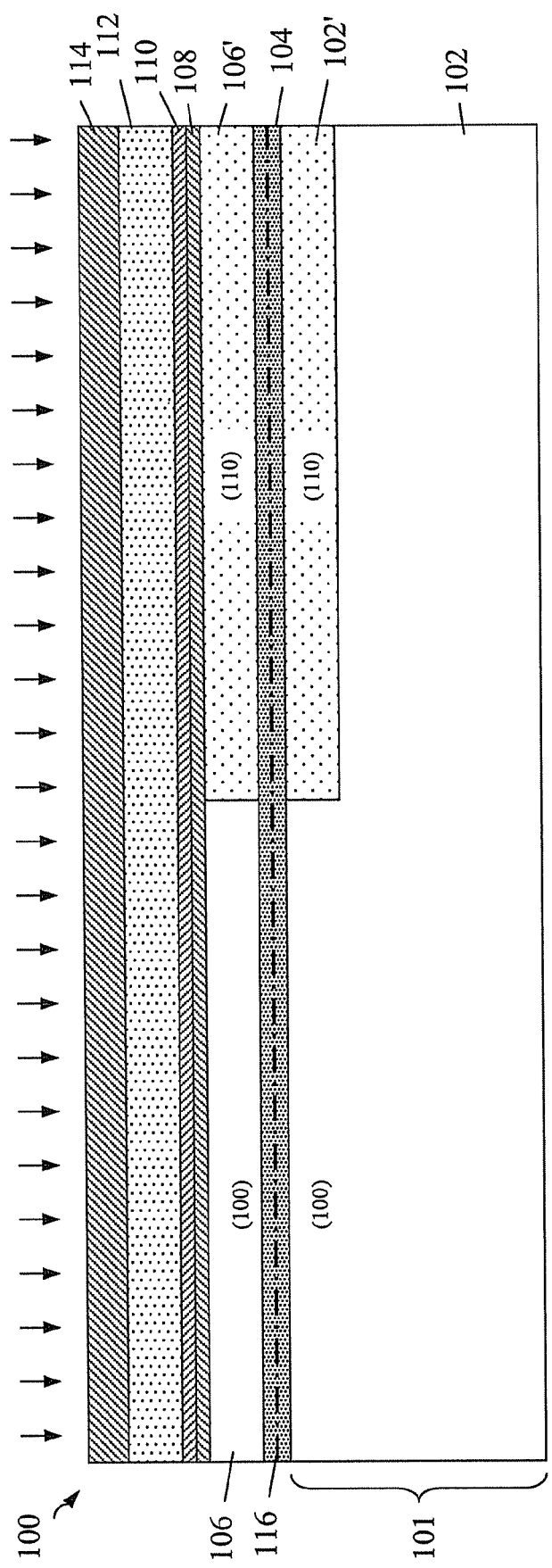

Disclosed herein is a hybrid, back gated ETSOI wafer structure for semiconductor devices having enhanced mobility channels for both NFET and PFET devices. The hybrid ETSOI wafer structure includes extremely thin, (100) crystal oriented semiconductor material (e.g., Si) for NFET devices and extremely thin, (110) crystal oriented semiconductor material (e.g., Si, SiGe, or Ge) for PFET devices, both of which regions include a thin back gate dielectric and a second buried oxide for back gate isolation. In so doing, the electron mobility is highest in (100) material while hole mobility is highest in (110) material. In addition, other stress techniques such as stressed CA liner formation, stressed memory techniques (SMT), or stress induced by metal gates may be subsequently applied. As a result, improved device performance is realized by mobility-enhanced channel materials in ETSOI, combined with double-BOX SOI, thereby enabling fully dielectrically-isolated back gating. This in turn can reduce front gate-to-back gate overlay capacitance, and reduce power consumption.

It should be understood that although terms such as "BOX" and "SOI" originate from specific acronyms in the art that define certain materials (e.g., oxide, silicon), such terms may also be applied to other materials such as insulators and semiconductors in general. That is, SOI can also describe other semiconductors besides silicon on insulators, and BOX can refer to other buried insulator materials besides oxides.

Referring generally now to the figures, FIG. 1 illustrates the formation of a first substrate portion 100, in which a prepared hybrid bulk substrate 101 having a (100) Si portion 102 and a (110) Si portion 102' has a sacrificial silicon germanium (SiGe) layer 104 (e.g., 5-1000 nanometers (nm) in thickness) deposited thereon, at an exemplary Ge concentration of about 10-35%. The hybrid bulk substrate 101 may be prepared by direct silicon bonding (DSB) or by hybrid orientation technology bonding (HOT B) with a wafer which has (100) Si and a (110) Si template. The sacrificial SiGe layer 104 has a (100) crystal orientation over the (100) Si portion 102 of the hybrid bulk substrate 101, and a (110) crystal orientation over the (110) portion 102'.

The sacrificial SiGe layer 104 is then followed by a thin layer (e.g., about 5-50 nm) of epitaxially grown silicon that will ultimately form a hybrid SOI layer of the double BOX structure. Again, in keeping with the pattern of the hybrid bulk substrate 101, the hybrid SOI layer comprises a (100) crystal portion 106 and a (110) crystal portion 106'. The hybrid SOI layer 106/106' may be formed in the same processing step as the SiGe layer 104 (e.g., by shutting off a Ge gas source after completion of the SiGe layer formation).

Then, a relatively thin (e.g., about 5-20 nm) oxide layer 108 is thermally grown or deposited on top of the hybrid SOI layer 106/106'. The oxide layer 108 may be thermally grown or deposited at a temperature of about 600-800° C., for example. As further shown in FIG. 1, an etch stop layer 110 is deposited at a thickness of about 5-10 nm on the oxide layer 108. The etch stop layer 110 is an insulator which may be a high dielectric constant (high-K) material such as, for example, SiN, $HfO_2$, $HfSiO_2$, $Al_2O_3$, etc. As used herein, a "high-K" material may refer to any material having a dielectric constant substantially greater than 4.0. Then, an electrically conductive layer 112 of back gate material (e.g., amorphous silicon, doped or undoped polysilicon, metal, metal silicide, metal nitride, etc.) of about 20-100 nm in thickness is deposited on the high-K etch stop layer 110.

In FIG. 2, another oxide layer 114 (e.g., about 10-100 nm) is thermally grown or deposited on the back gate layer 112, which defines a subsequent oxide bonding interface. Then, as shown in FIG. 3, a hydrogen implant step is performed (as indicated by the arrows) in order to insert a layer of hydrogen species within or beyond the SiGe layer 104, in accordance with the well known Smart-Cut® process described in U.S. Pat. No. 5,374,564. In order to prevent damage to the hybrid SOI layer 106/106', the hydrogen species implant conditions should be such that the species stops or peaks at a suitable location such as in the SiGe layer 104, as indicated by implant region 116 in FIG. 3.

Figure 4:
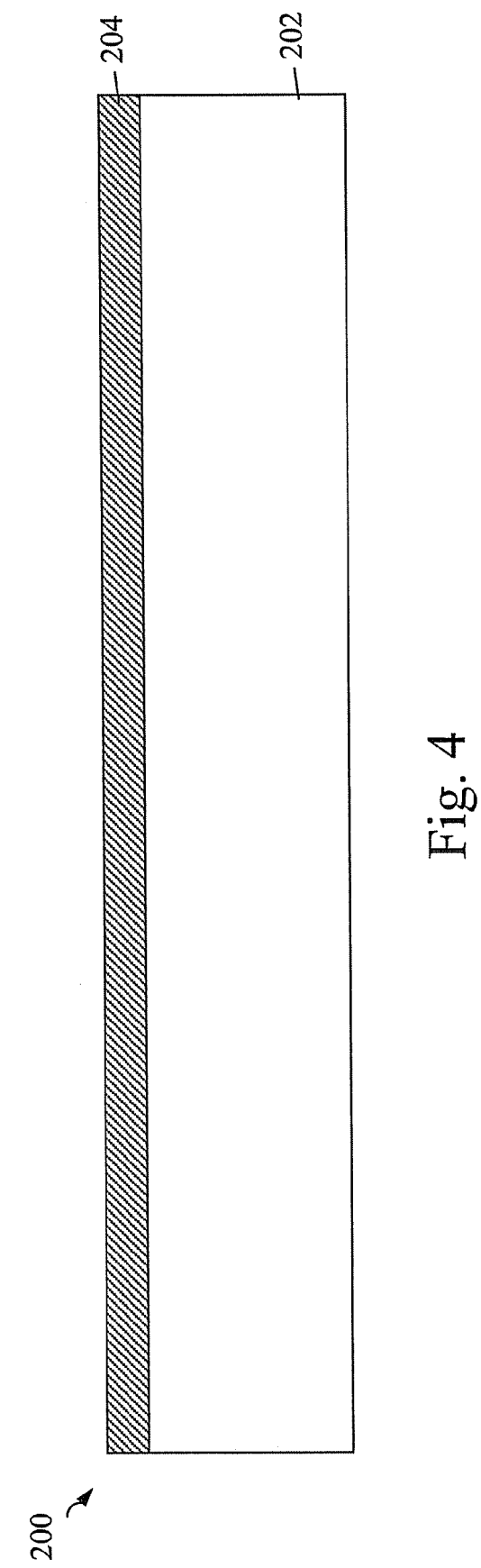
Figure 5:
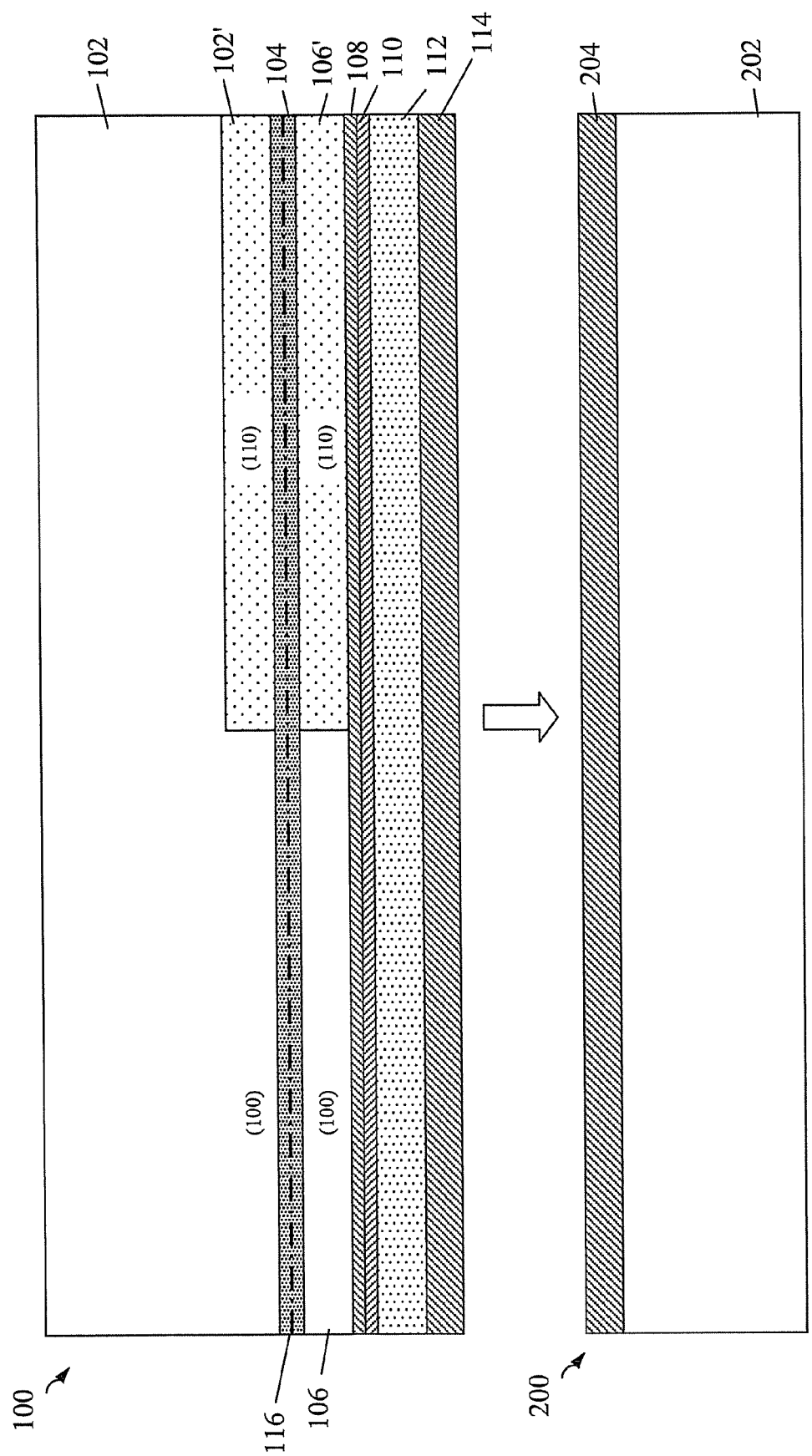

Referring next to FIG. 4, there is shown the formation of a second substrate portion 200, in which a bulk silicon substrate 202 has an oxide layer 204 (e.g., 10-100 nanometers (nm) in thickness) thermally grown or deposited thereon. FIG. 5 illustrates the bonding of the first substrate portion 100 to the second substrate portion 200, wherein the deposited oxide layer 114 of the first substrate portion 100 is bonded to the oxide layer 204 of the second substrate portion 200 through oxide-to-oxide bonding. Thus bonded, layers 114 and 204 combine to define a lower BOX layer for a double BOX substrate. A first annealing procedure (e.g., at about 300° C.) is performed in order to enhance the bonding interface between layers 114 and 204.

Figure 6:
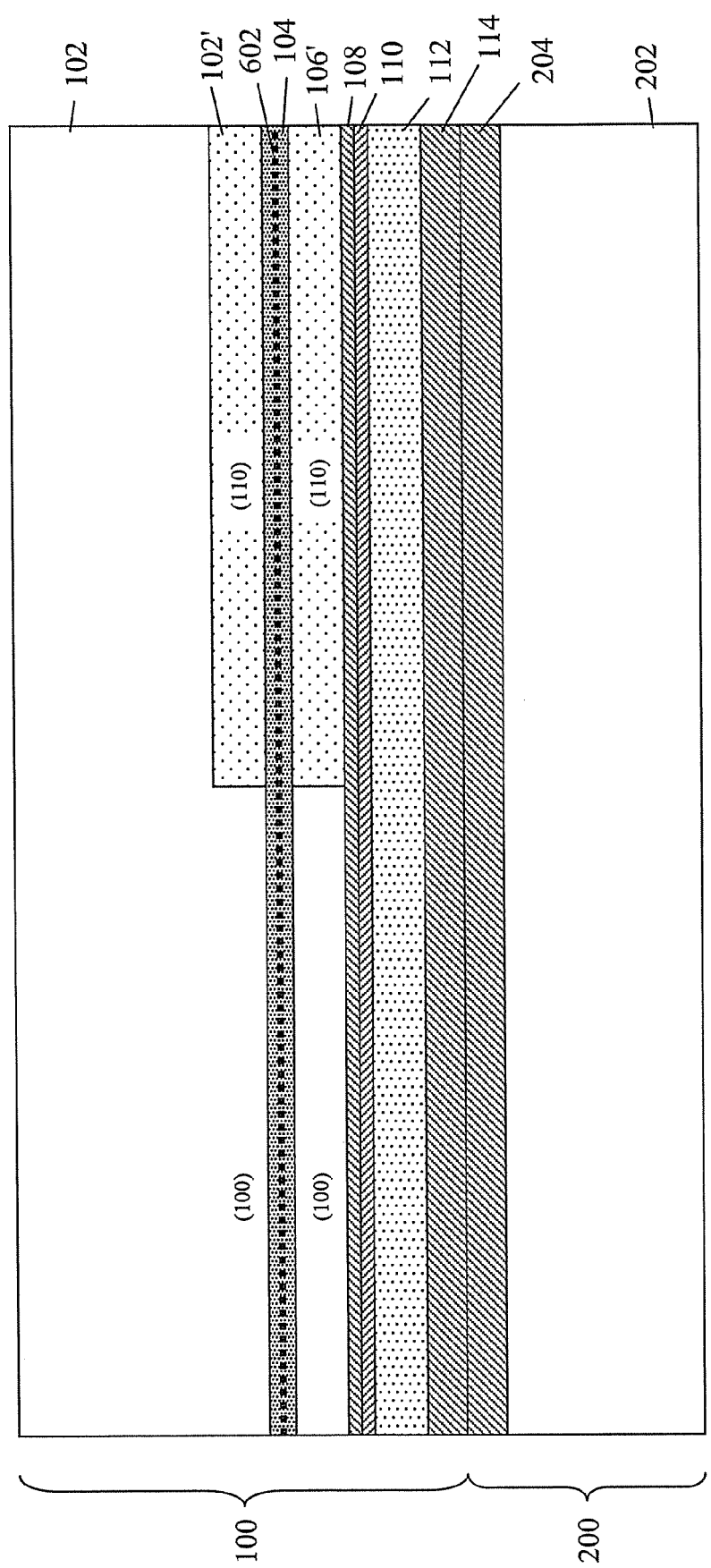
Figure 7:
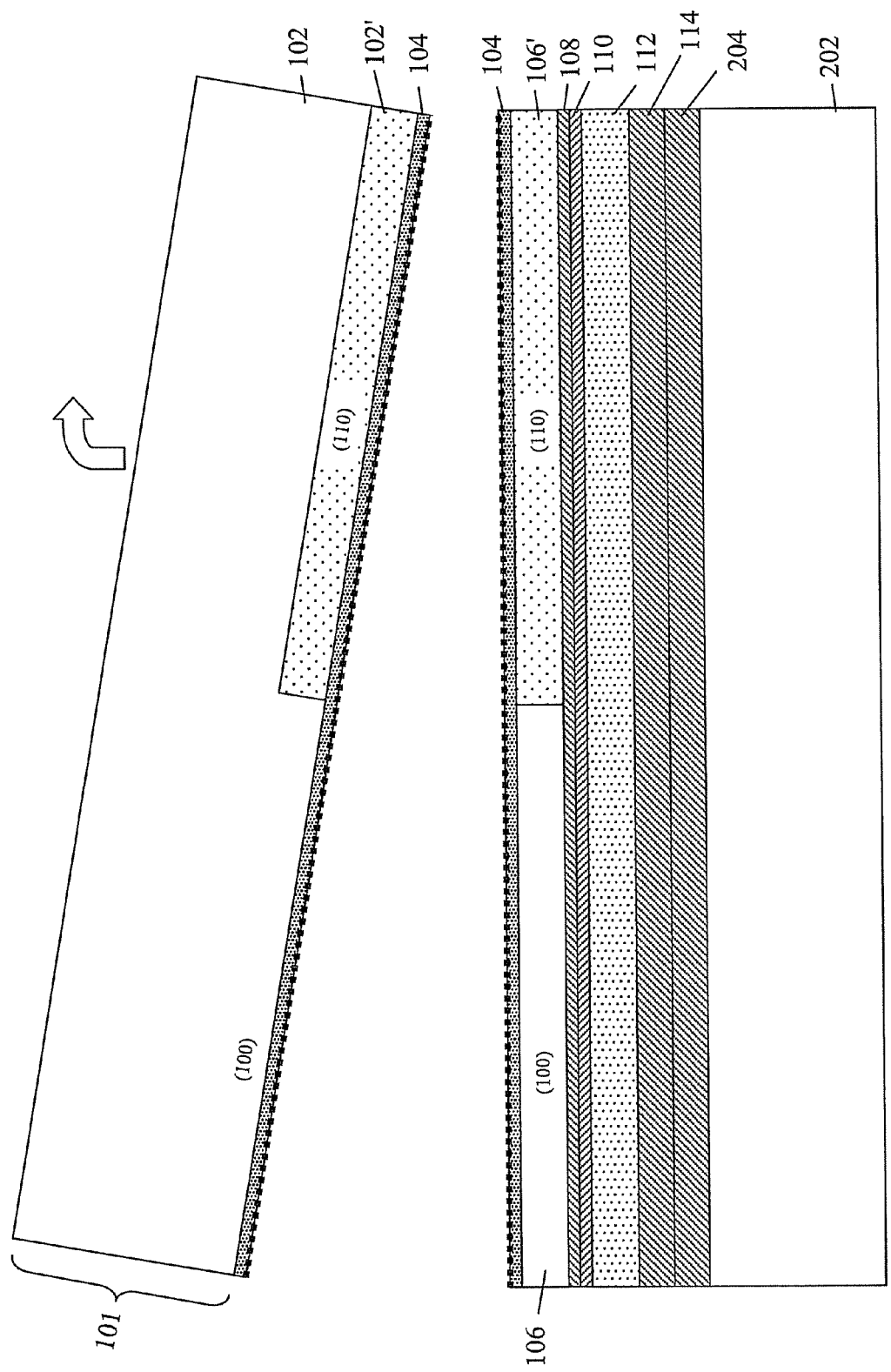
Figure 8:
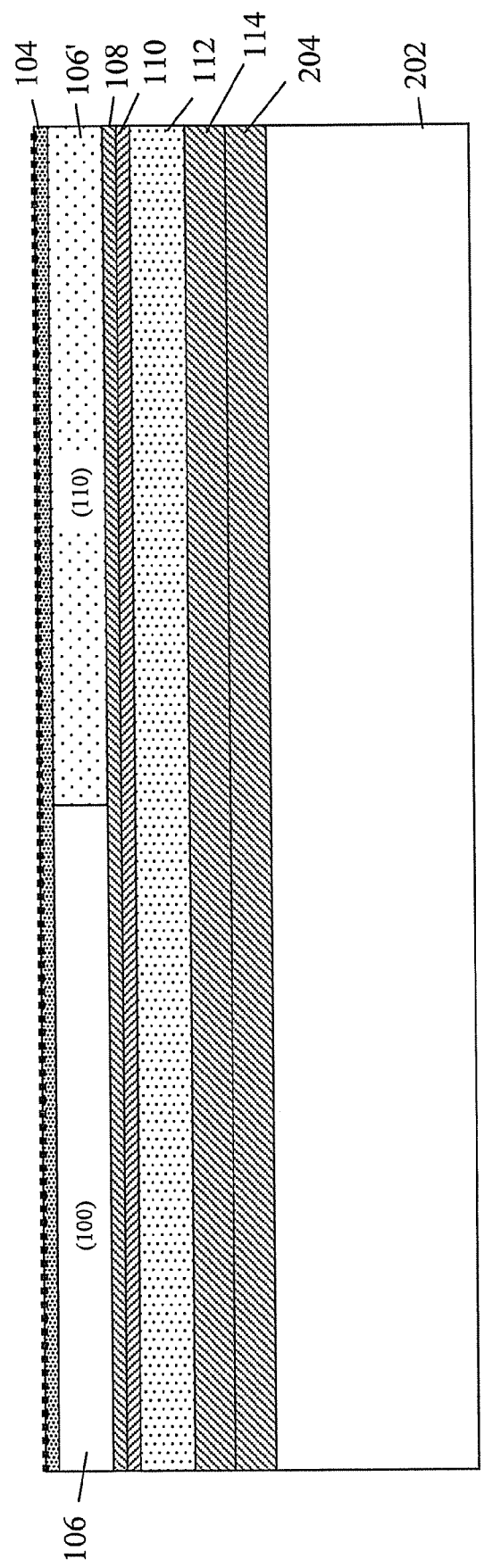

As then shown in FIG. 6, the structure undergoes a second annealing procedure (at a higher temperature than the first annealing procedure, e.g., at about 400° C.) so as to cause the hydrogen species to form a front of connecting voids 602 of hydride regions within the SiGe layer 104. The structure is then fractured along the front as shown in FIG. 7. The top portion including hybrid bulk substrate 101 and a portion of the SiGe layer 104 is then removed, leaving the structure as shown in FIG. 8 in which a portion of the SiGe layer 104 remains following wafer separation. Again, it will be appreciated that in the event the implant region 116 is substantially defined beyond the SiGe layer 104 and into the hybrid bulk substrate 101 during the implant procedure of FIG. 3, then the separation along the front in FIG. 7 would be depicted within hybrid bulk substrate 101, and a portion thereof would remain atop the structure shown in FIG. 8.

Figure 9:
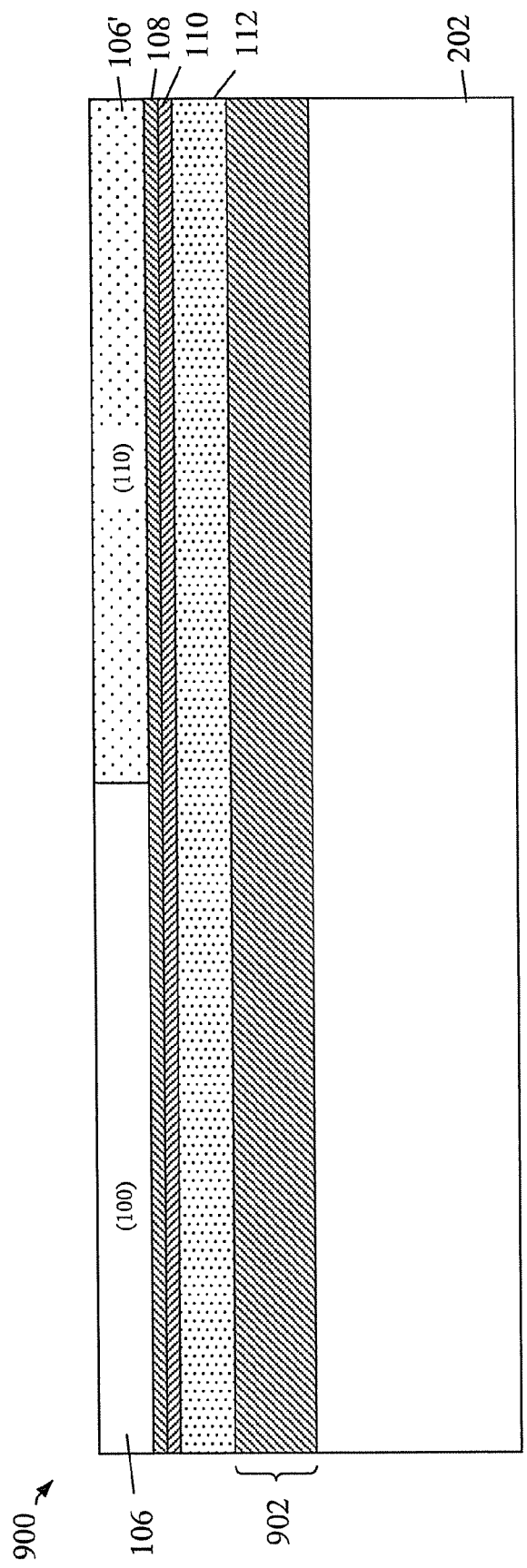

Next, any remaining portion of the hybrid bulk substrate 101 is removed, for example, by polishing or by a selective wet etch with respect to silicon (e.g., a tetramethylammonium hydroxide (TMAH) etch), and the remaining SiGe layer 104 is removed using an etch selective with respect to SiGe such as a hot Huang A type solution ($NH_4OH:H_2O_2:H_2O$). Then, another annealing procedure (at a higher temperature than the second annealing procedure, e.g., at about 800-1000° C.) is then performed to further enhance the oxide-to-oxide bonding. As shown in FIG. 9, this results in a hybrid double BOX back gate structure 900 having a bulk substrate 202, a lower BOX layer 902 (having the oxide bonding interface therein) over the substrate 202, a conductive back gate layer 112 over the lower BOX layer 902, an etch stop layer 110 over the conductive back gate layer 112, an upper BOX layer 108 over the high-K etch stop layer 110 and a hybrid SOI layer 106/106' over the upper BOX layer 108. Moreover, the hybrid DBBG SOI structure 900 is formed in a manner such that an expensive SOI starting substrate is not needed beforehand, and in a manner where the thickness of the remaining hybrid SOI layer 106/106' and the dielectric layers 108 and 110 are all well controlled. The etch stop layer 110 over the conductive back gate layer 112 provides a wet and dry etch isolation from a subsequent dual-depth shallow trench isolation (STI) fabrication process for both the back gate and the active regions, and serves as a current leakage barrier for subsequent device operations.

The hybrid DBBG SOI structure 900 as shown in FIG. 9 can be used in a subsequent dual-depth, self-aligned STI formation process in which, for example, transistor areas may be defined and dielectrically isolated by shallow STI regions within a given crystal orientation type SOI layer (e.g., isolating NFETs within the (100) SOI layer 106), and functional dielectrically-isolated back gates for individual transistors or groups of transistors may be defined by deeper STI regions passing through the back gate layer (e.g., isolating areas for back gate wells in layer 112 and isolating NFETs in (100) SOI layer 106 from PFETs in (110) SOI layer 106').

Figure 10:
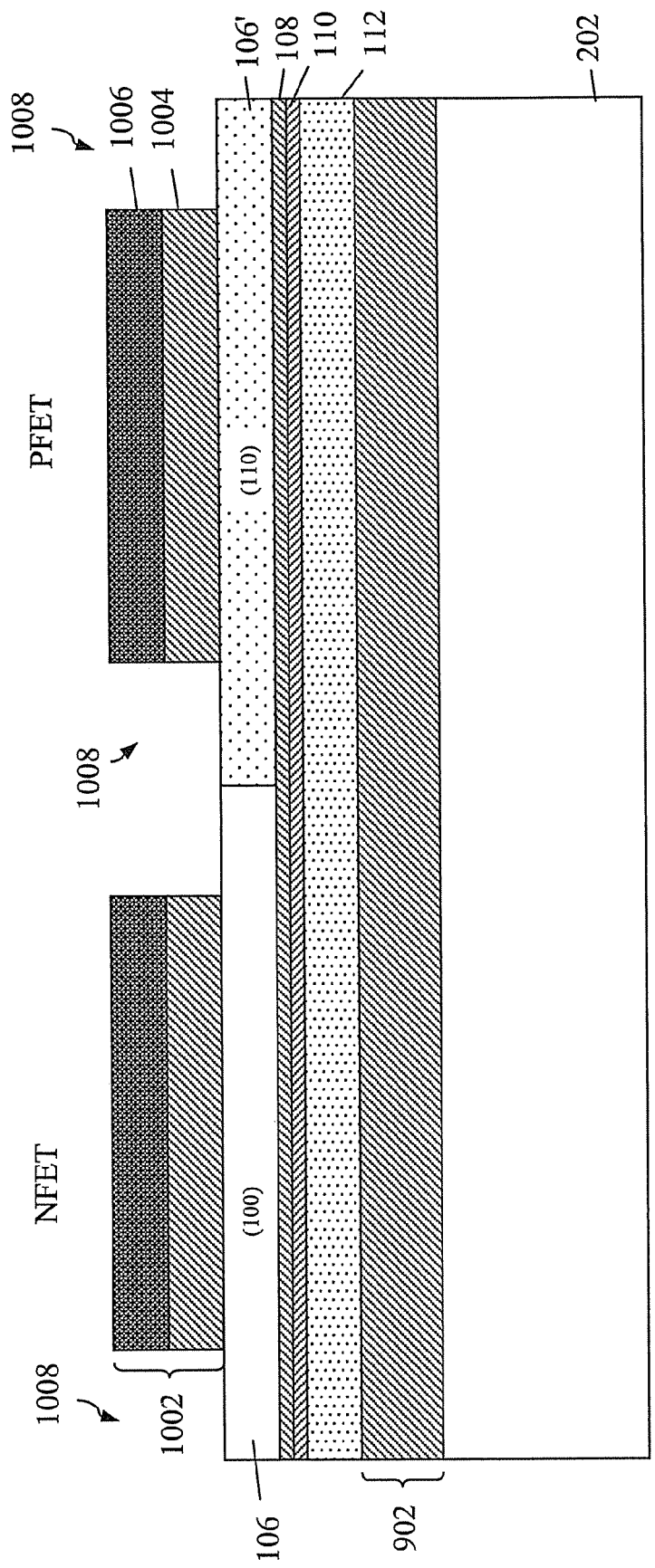

Referring now to FIG. 10, the hybrid DBBG SOI structure is shown following patterning of a hardmask layer 1002, which may include a high density plasma (HDP) deposited oxide layer 1004 and an SiN layer 1006, thus defining shallow STI recesses 1008 for transistor device isolation. Portions of one or more of the STI recesses 1008 defined at this level will also define lower and deeper STI recesses at the back gate level, which in turn will be self-aligned to the corresponding shallower STI recesses at the SOI level.

Figure 11:
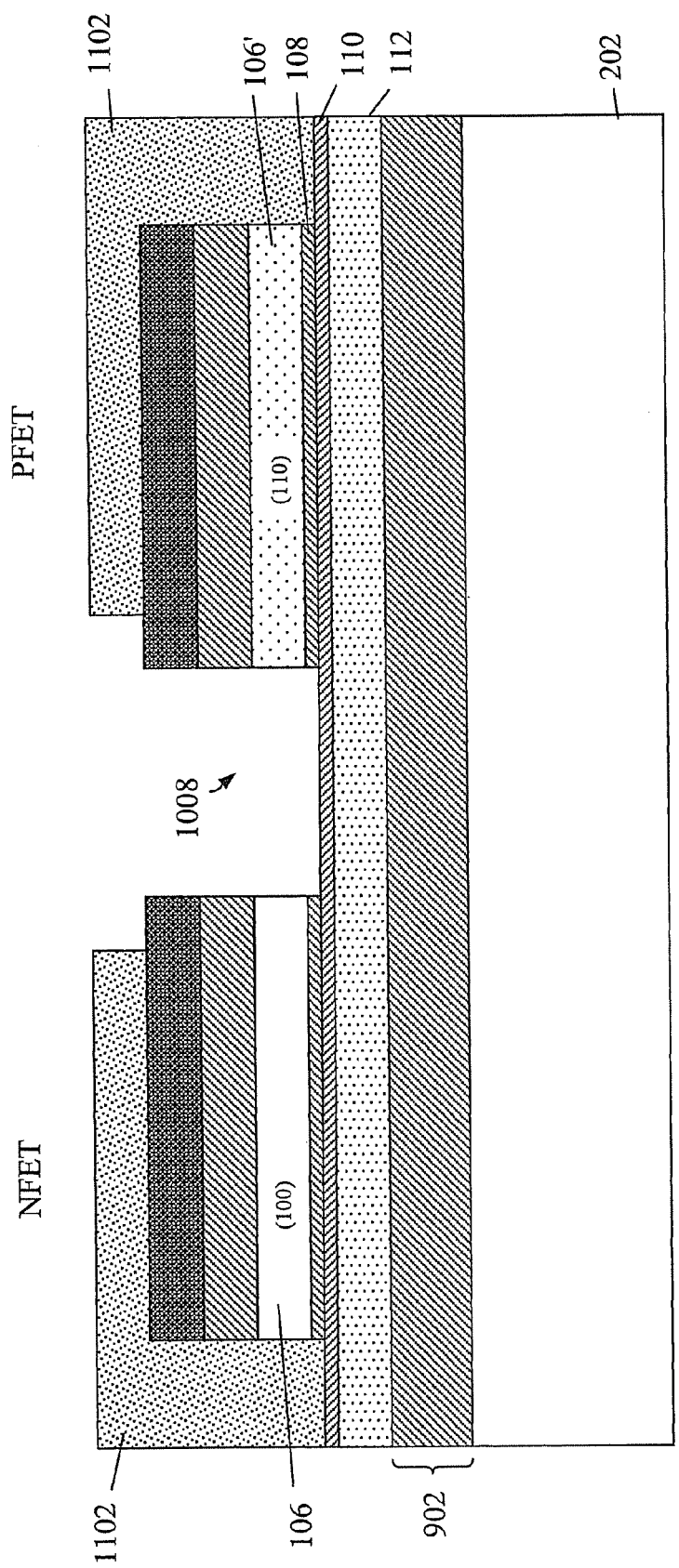

The shallow recess STI pattern is then etched through the hybrid SOI layer 106/106' and the upper BOX layer 108, stopping on the etch stop layer 110, as shown in FIG. 11. A photoresist layer 1102 is then used to cover the active areas of the device, followed by exposure and selective removal of the resist to expose a portion of one or more of the shallow STI recesses 1008 where the deeper back gate level STI recesses are to be formed. In the exemplary embodiment illustrated, the shallow STI recess 1008 between the (100) SOI layer 106 and the (110) SOI layer 106' is exposed for further etching in FIG. 11.

Figure 12:
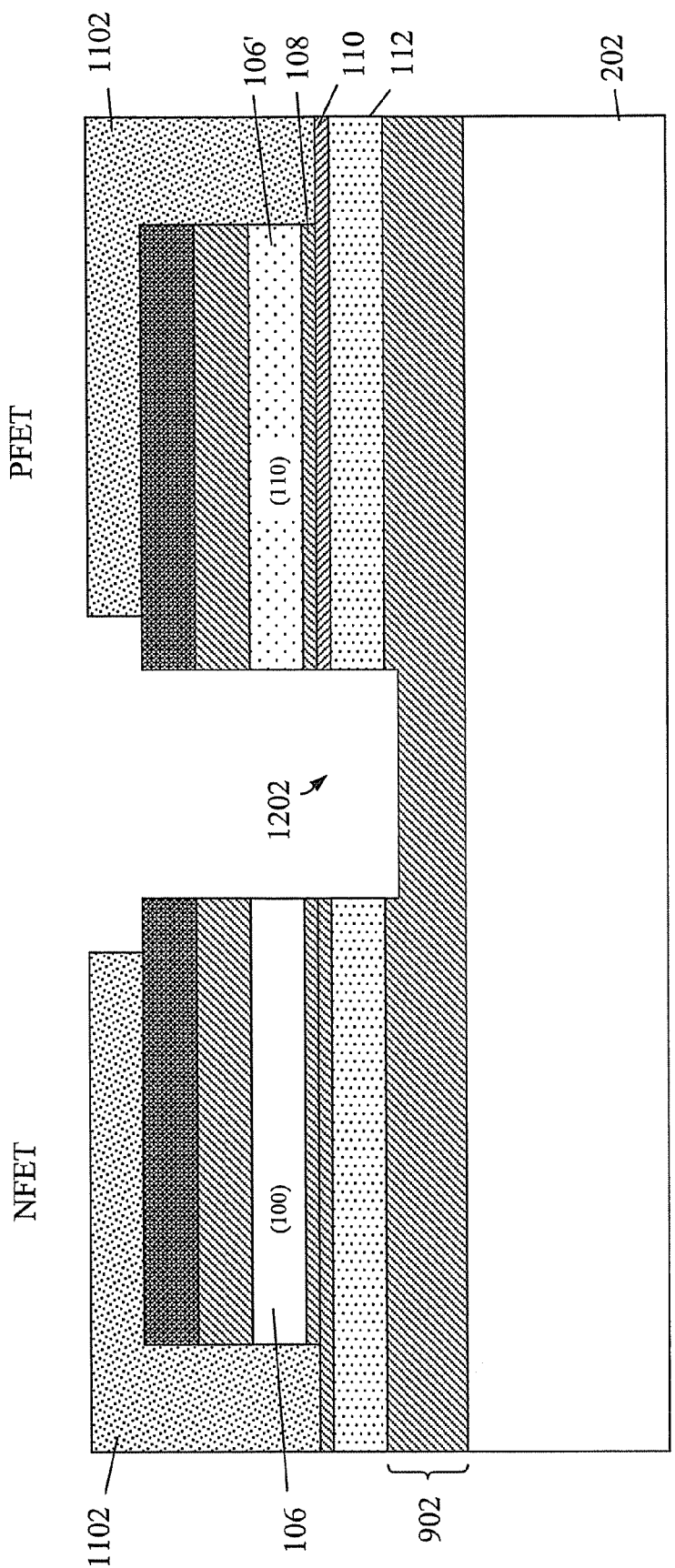

Then, as shown in FIG. 12, the deeper back gate level STI recess(es) are defined by etching, beginning with the etch stop layer 110 (using a separate etch chemistry with respect to the SOI level shallower STI etching), through the back gate layer 112 (again changing etch chemistry), and stopping on or in the lower BOX 902. Thereby, a deeper recess 1202 for a back gate level STI is defined.

Figure 13:
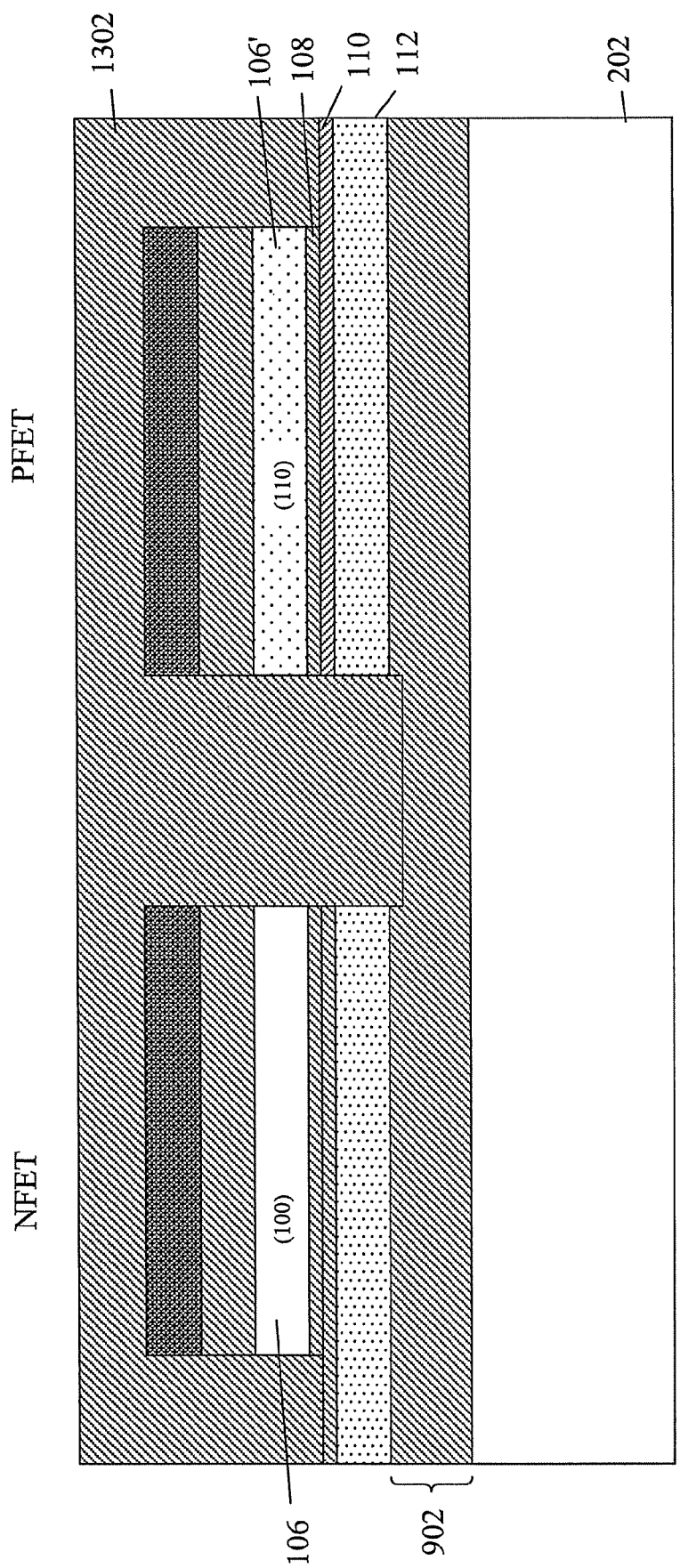
Figure 14:
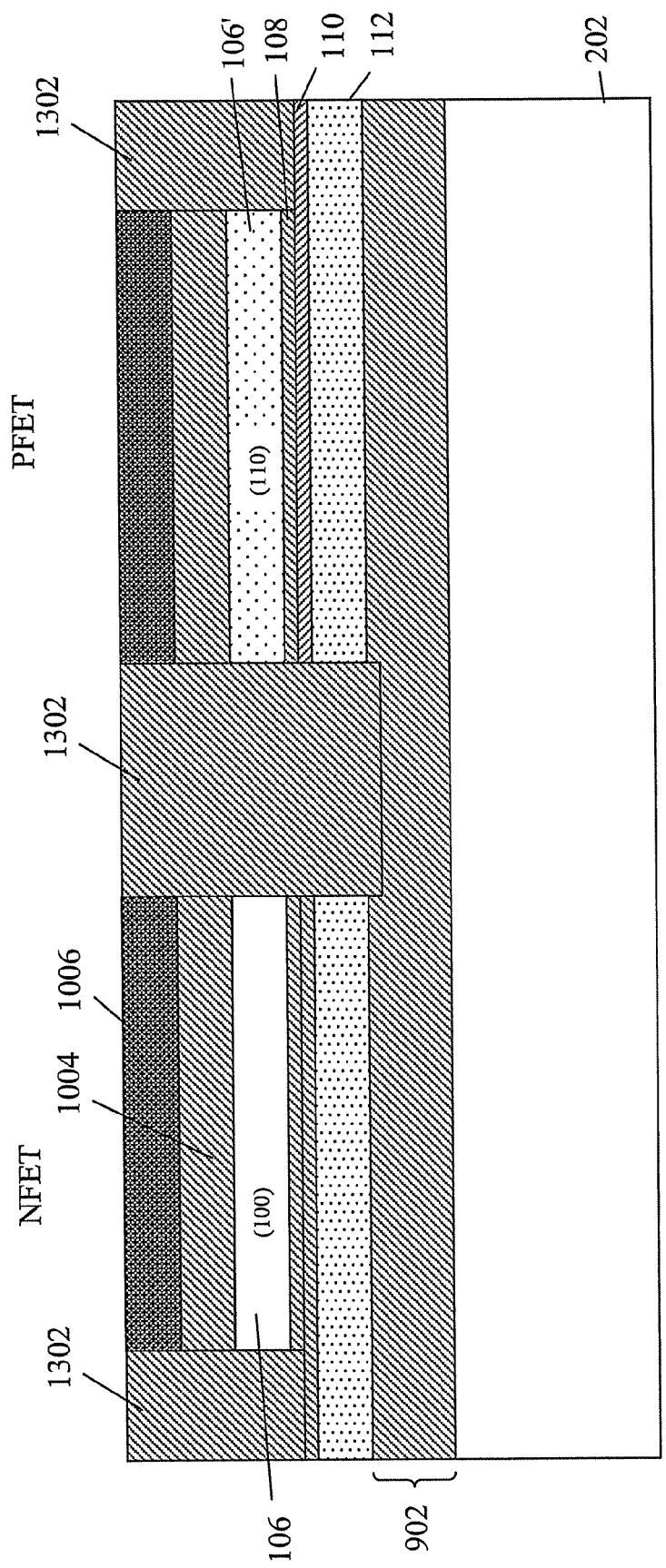

Both the shallow (1008) and the deep (1202) STI recesses are filled with deposition of dielectric material(s) such as HDP oxide. Additional layers of other insulating materials can be included in the STI fill as well. FIG. 13 shows the structure in FIG. 12 after the STI fill process. The wafer is then treated with a high-temperature annealing procedure (e.g., at 1000° C.) to render densification of the deposited STI fill materials that are to be processed for the subsequent chemical and mechanical polish (CMP). The deposited STI fill materials are thinned down by a chemical and mechanical polishing (CMP) process and polished into the SiN layer 1006 to a given depth (e.g., 10-15 nm), as shown in FIG. 14.

Figure 15:
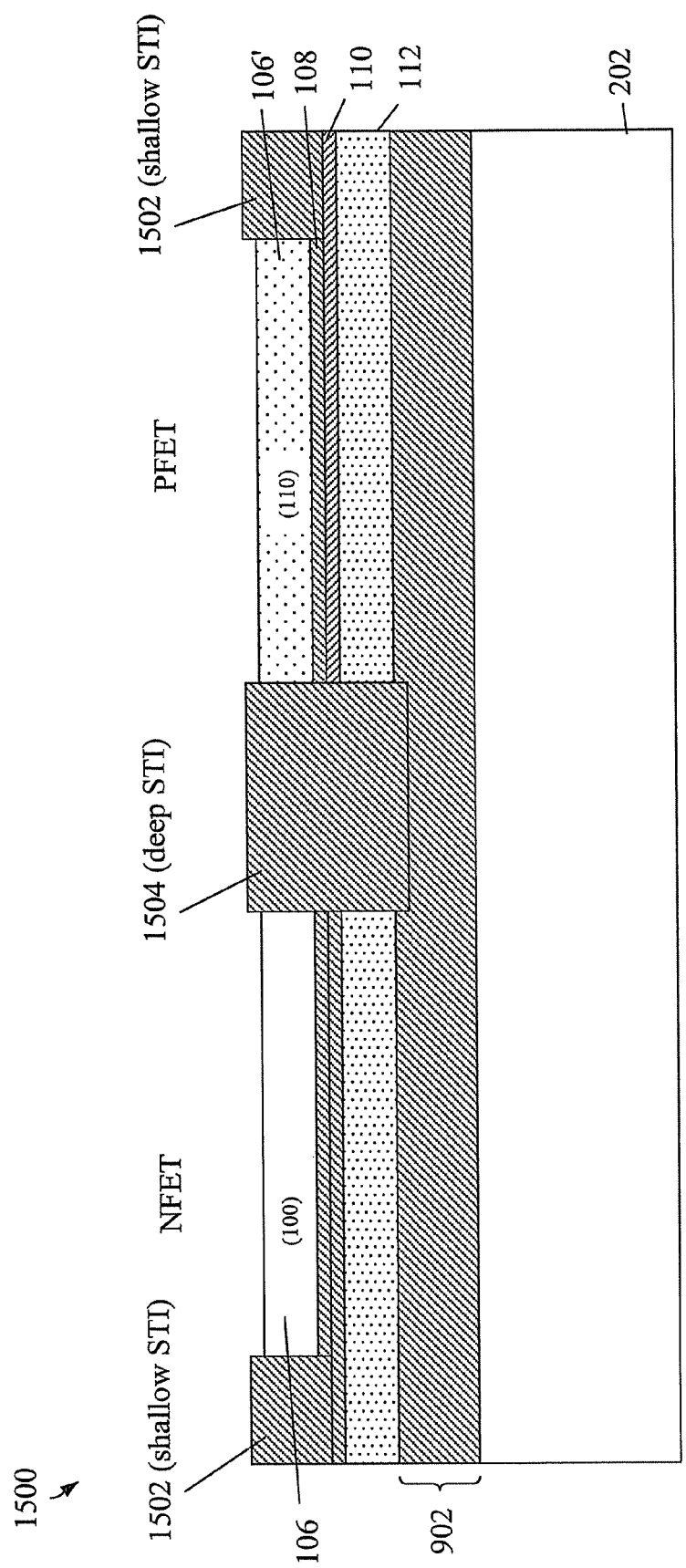

In FIG. 15, the active area hardmask is removed by chemical etching (using different chemicals to remove the SiN layer 1006 and the HDP oxide layer 1004), thereby resulting in a hybrid, back gated ETSOI wafer structure 1500 with dual-depth, self-aligned STI formations. In particular, FIG. 15 shows that the shallow STI regions 1502 and the deep STI regions 1504, formed by a self-aligned process, facilitate dielectric isolations between the FETs and between the back gate areas for NFET and PFET. Moreover, because of the extremely thin hybrid SOI layer 106/106', carrier mobility is enhanced due to the capability of forming NFET devices on (100) ETSOI and PFET devices (110) ETSOI.

Figure 16:
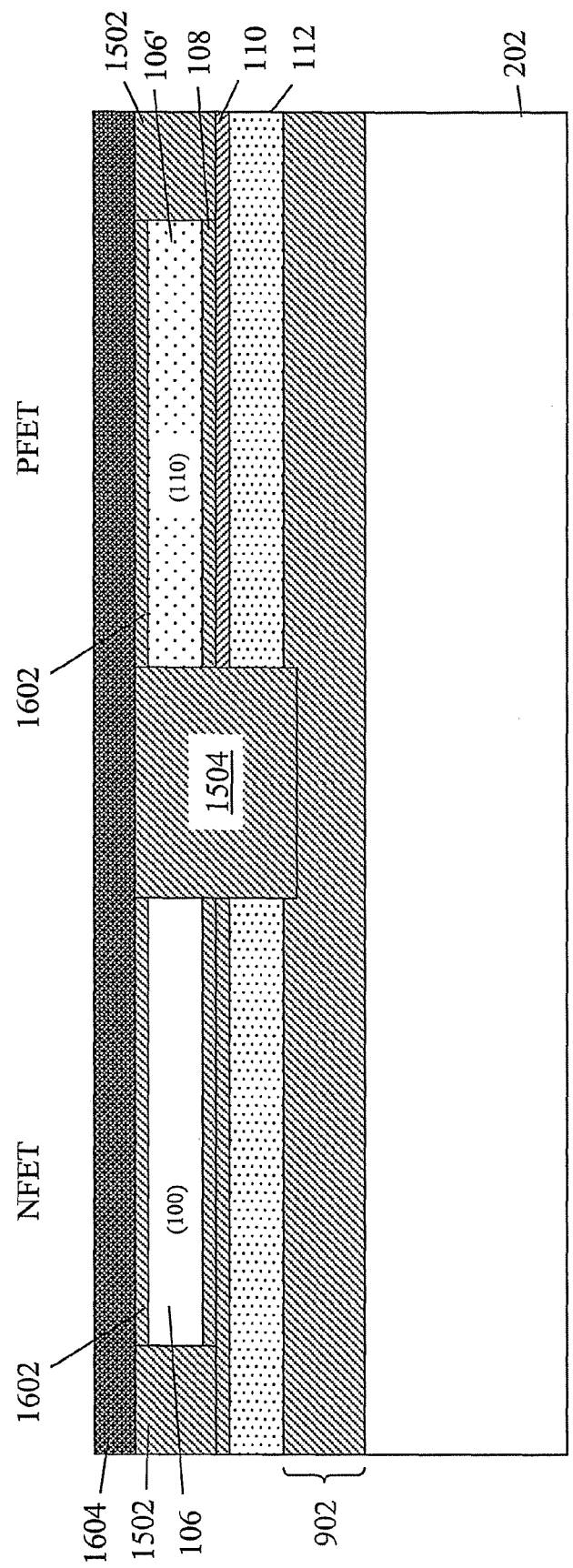
FIGS. 16-22 illustrate further device processing to replace the SOI layer of one crystal orientation with a different semiconductor material of the same crystal orientation to provide additional channel strain, in accordance with a further embodiment of the invention.
Figure 17:
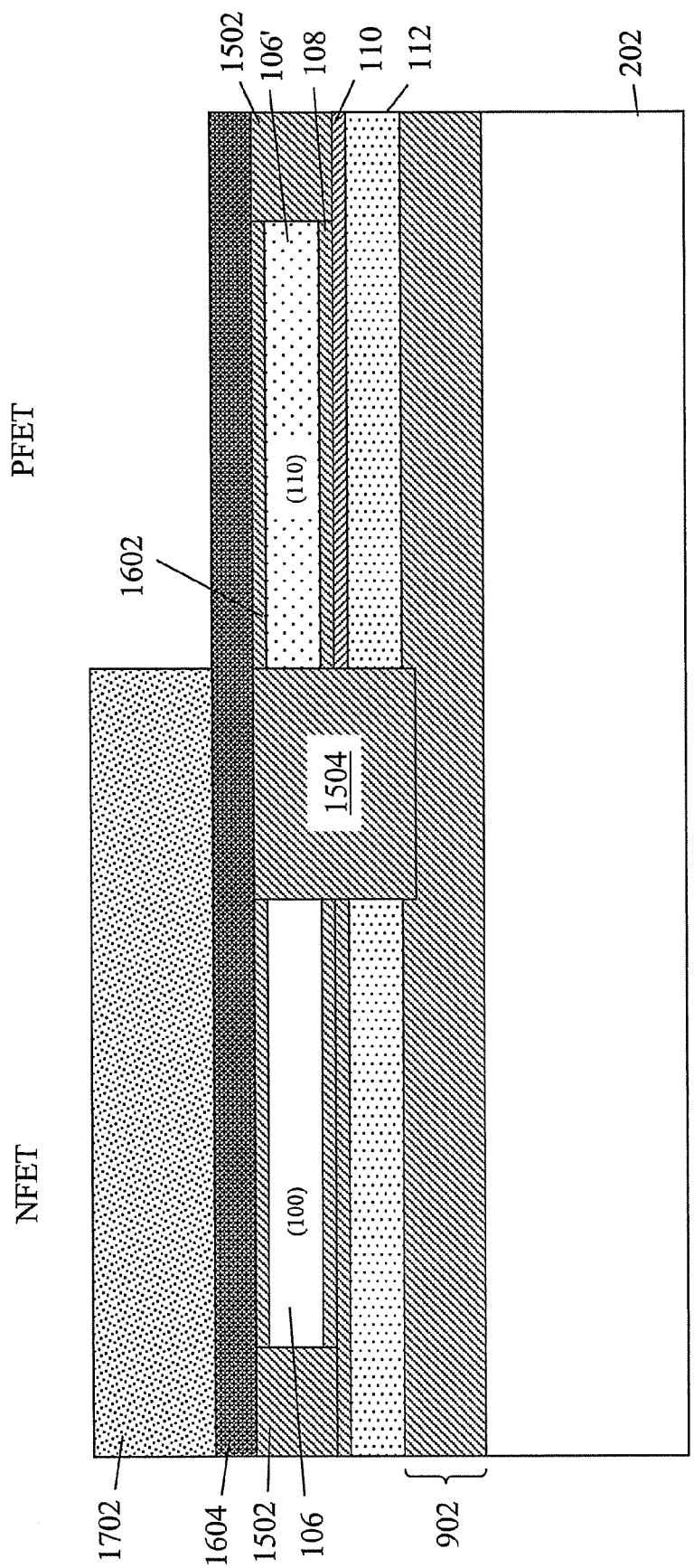
Figure 18:
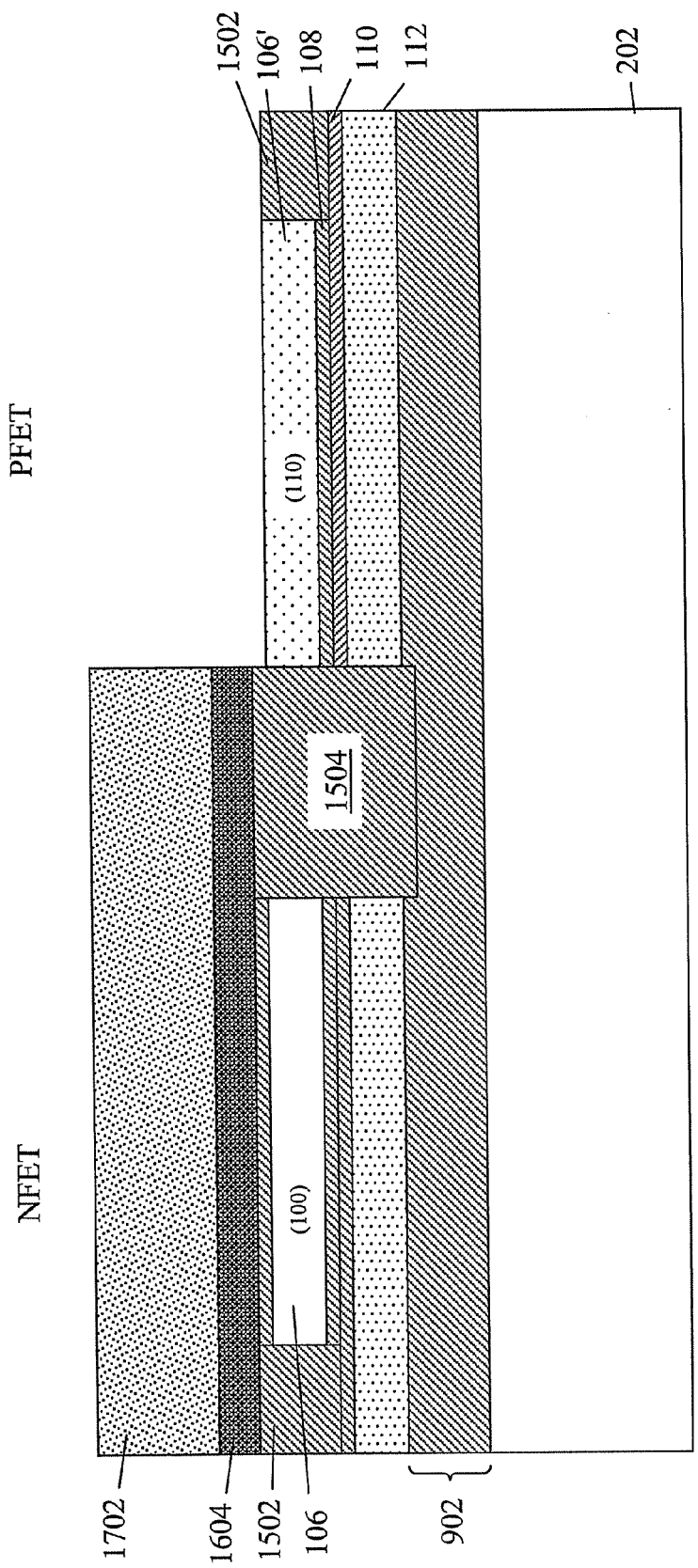

In the event that even further carrier mobility enhancement is desired in the PFET regions of the device, the (110) Si 106' of the structure of FIG. 15 could also be replaced with (110) SiGe, which provides a compressive channel stress to enhance hole mobility. Proceeding to FIG. 16, a hardmask layer, including a pad oxide 1602 and pad nitride layer 1604 is formed over the device. A photoresist layer 1702 is then patterned to expose the regions corresponding to the (110) Si layer 106', as shown in FIG. 17. The exposed portions of the pad nitride 1604 and pad oxide 1602 are then removed, such as for example, by reactive ion etching (RIE) and dilute hydrofluoric acid (DHF) etching, respectively, as shown in FIG. 18.

Figure 19:
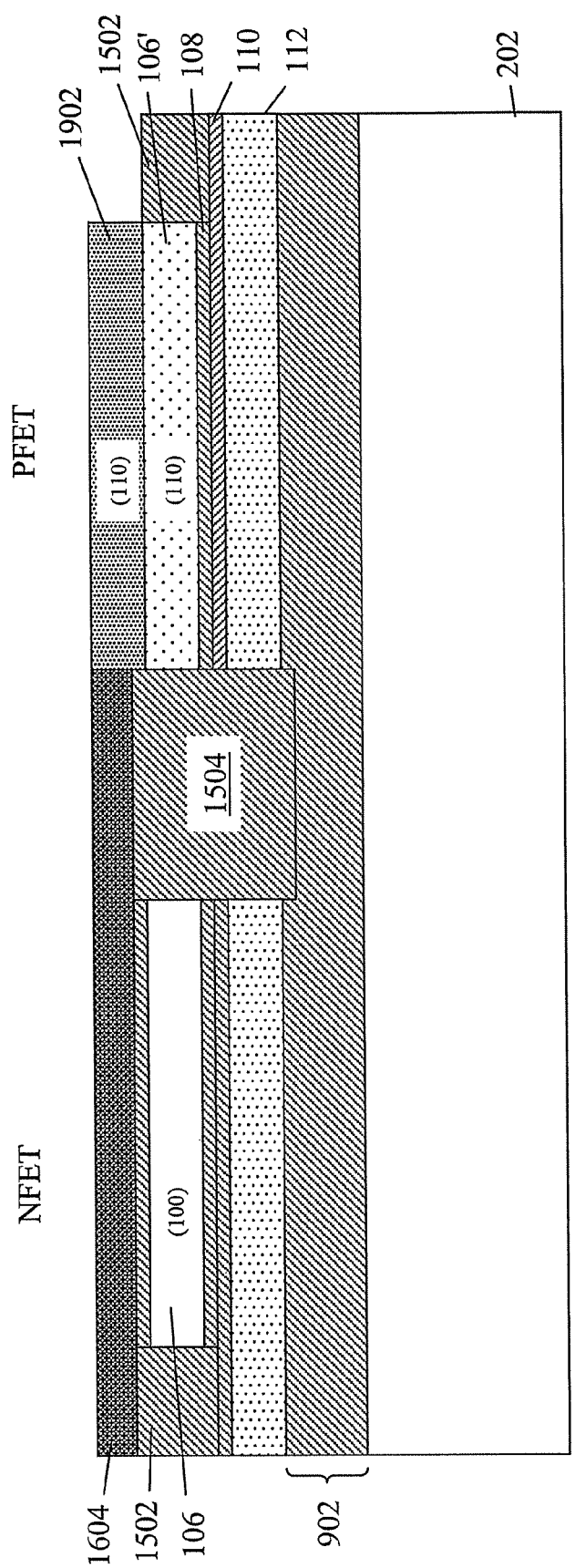
Figure 20:
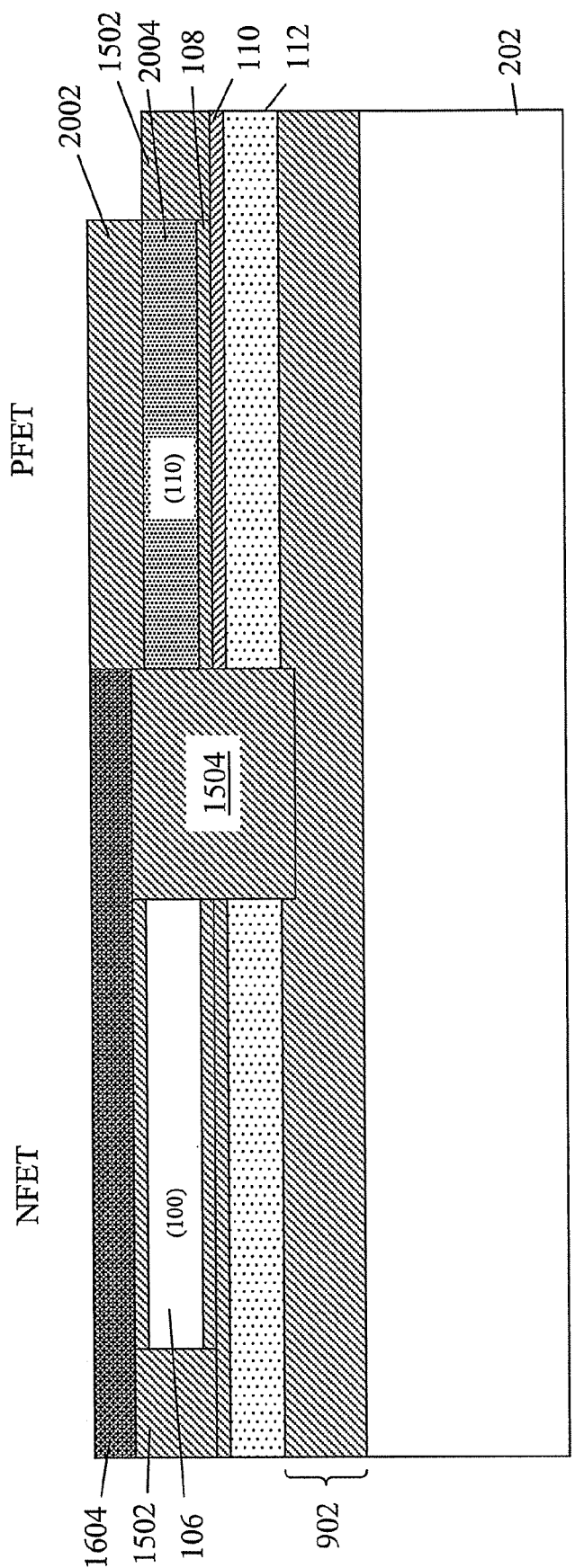

Referring now to FIG. 19, the remaining resist is removed, followed by selective epitaxial growth of a SiGe layer 1902 atop the exposed (110) Si layer 106'. Like the (110) Si layer 106', the SiGe layer 1902 also has a (110) crystal orientation. Then, as shown in FIG. 20 a high temperature oxidation in a dry $O_2$ environment is used to oxidize the SiGe layer 1902, converting it to an $SiO_2$ layer 2002. As a result, the germanium "condensation" of Ge atoms displaced from the original SiGe 1902 layer down to the (110) Si layer 106' converts the same into a strained (110) SiGe layer 2004 disposed directly atop the upper BOX layer 108. Additional information regarding the Ge condensation process may be found in the publication entitled "Strained SOI/SGOI Dual-channel CMOS Technology Based on the Ge Condensation Technique," Semicond. Sci. Technol. 22 (2007), pp. S93-98, by Tezuka, et al., the contents of which are incorporated herein by reference in their entirety.

Figure 21:
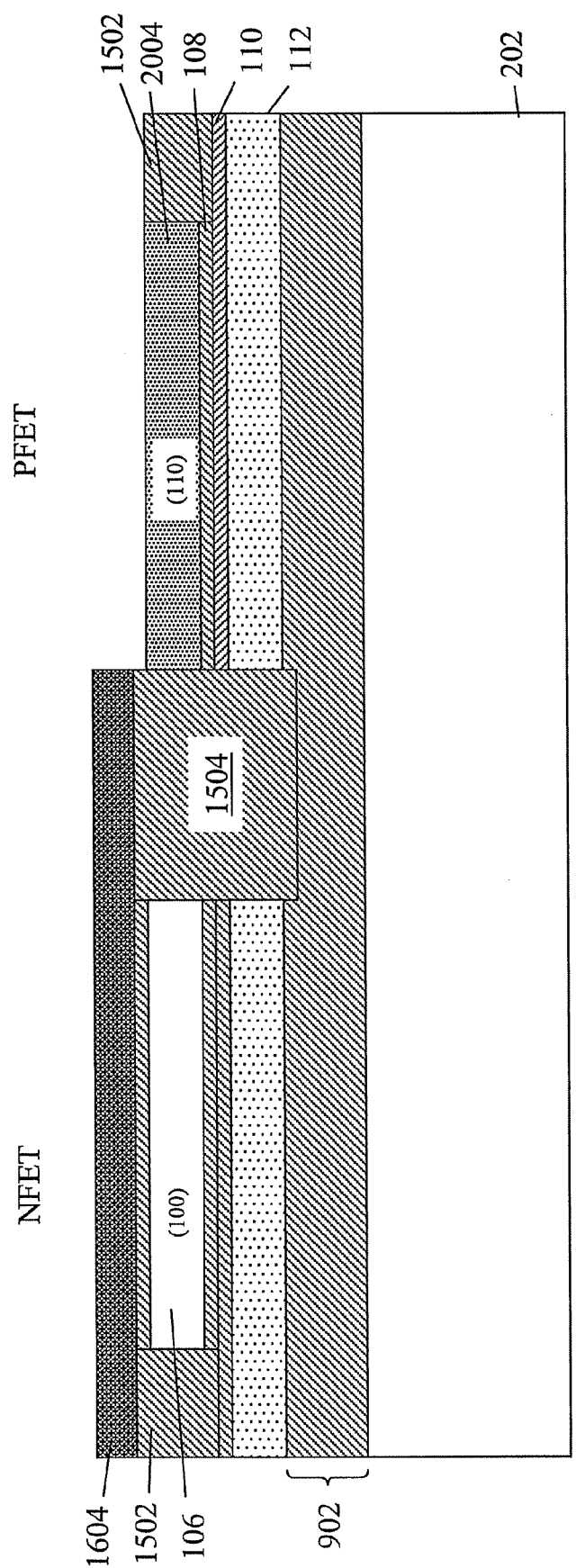
Figure 22:
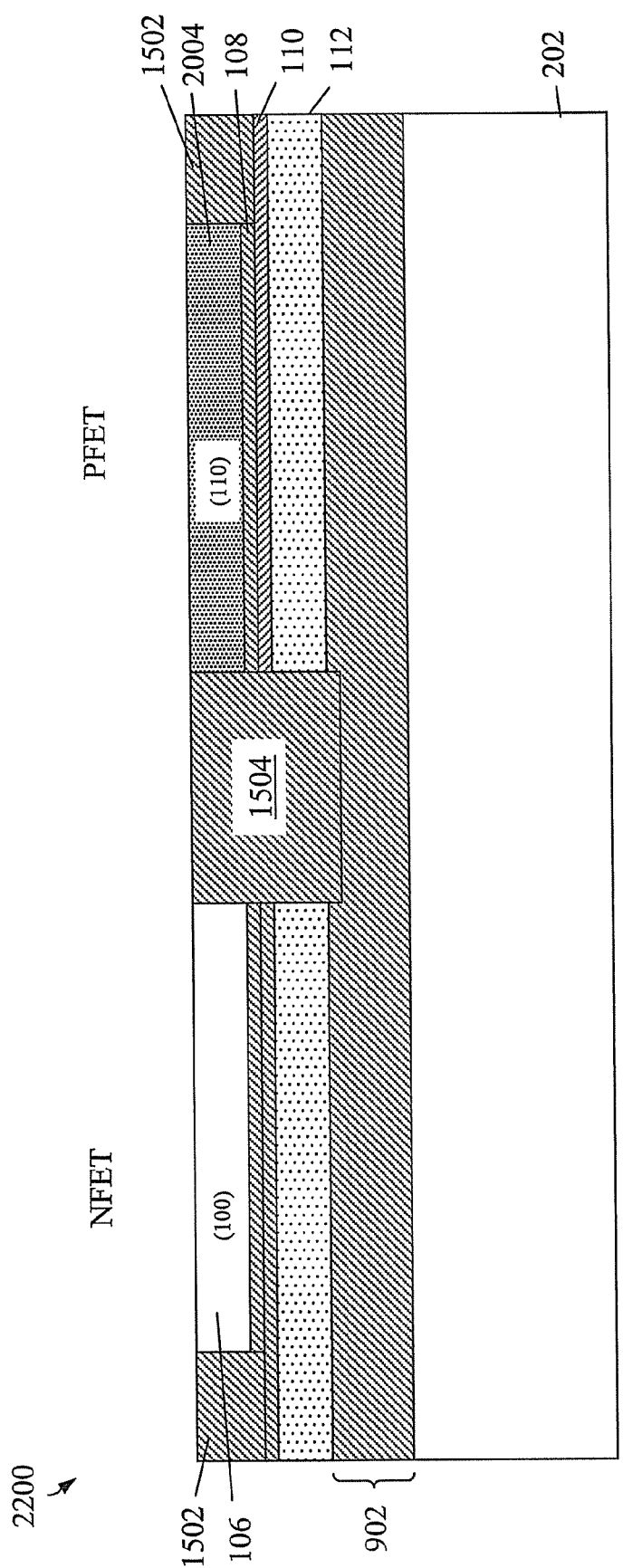

The converted $SiO_2$ layer 2002 of FIG. 20 is then removed in FIG. 21, such as by a DHF wet etch, exposing the newly formed extremely thin (110) SiGe layer 2004. Finally, as shown in FIG. 22, the pad nitride and oxide layers 1604, 1602 on the (100) portions of the device are removed, thereby defining another embodiment of a hybrid, back gated ETSOI wafer structure 2200 with dual-depth, self-aligned STI formations. In comparison to the embodiment 1500 of FIG. 15, the structure 2200 is hybrid not only as to the crystal orientations between NFET and PFET regions, but also as to the semiconductor material (Si vs. SiGe) for additional hole mobility enhancement, realized through a few additional processing steps.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor wafer structure for integrated circuit devices, comprising:
   a bulk substrate;
   a lower insulating layer formed on the bulk substrate;
   an electrically conductive back gate layer formed on the lower insulating layer;
   an upper insulating layer formed on the back gate layer;
   a hybrid semiconductor-on-insulator layer formed on the upper insulating layer, the hybrid semiconductor-on-insulator layer comprising a first portion having a first crystal orientation and a second portion having a second crystal orientation;
   a plurality of shallow active area level STI recesses formed through the hybrid semiconductor-on-insulator layer; and
   one or more deep back gate level STI recesses formed through the upper insulating layer and the back gate layer, the one or more deep back gate level STI recesses having portions thereof self-aligned to portions of one or more of the shallow active area level recesses;
   wherein both the shallow active area STI recesses and the one or more self-aligned deep back gate level STI recesses are filled with one or more insulating materials.

2. The structure of claim 1, wherein the first crystal orientation comprises a (100) crystal orientation and the second crystal orientation comprises a (110) crystal orientation.

3. The structure of claim 1, wherein the first portion of the hybrid semiconductor-on-insulator layer comprises (100) silicon, and the second portion of the hybrid semiconductor-on-insulator layer comprises (110) silicon.

4. The structure of claim 1, wherein the second portion of the hybrid semiconductor-on-insulator layer comprises (100) silicon, and the second portion of the hybrid semiconductor-on-insulator layer comprises one of: (110) silicon germanium and (110) germanium.

5. The structure of claim 1, wherein the upper insulator layer further includes an etch stop layer on the back gate layer.

6. The structure of claim 5, wherein:
   a bottom surface of the shallow active area level STI recesses stops on an etch stop layer included in the upper insulating layer;
   a bottom surface of the one or more deep back gate level STI recesses stops on the lower insulating layer;
   the upper insulator layer further comprises an oxide layer on the etch stop layer; and
   the lower insulator layer further comprises an oxide layer, the lower insulator layer corresponding to a lower buried oxide (BOX) layer and the upper insulator layer corresponding to an upper BOX layer.

7. A method of forming a semiconductor wafer structure for integrated circuit devices, the method comprising:
   forming a first substrate portion, the first substrate portion further comprising a hybrid bulk substrate having a first crystal orientation portion and a second crystal orientation portion, a sacrificial layer formed on the hybrid bulk substrate, a hybrid semiconductor layer formed on the sacrificial layer, a first insulating layer formed on the hybrid semiconductor layer, an electrically conductive layer formed over the first insulating layer, and a second insulating layer, suitable for bonding to another insulating layer, formed on the electrically conductive layer;
   forming a second substrate portion having a bulk substrate and a third insulating layer formed on the second bulk substrate;
   bonding the second substrate portion to the first substrate portion so as to define a bonding interface between the second and third insulating layers;
   separating the resulting bonded structure at a location within the hybrid bulk substrate or the sacrificial layer and removing any remaining portion of the hybrid bulk substrate; and
   removing any remaining portion of the sacrificial layer so as to define a hybrid double buried insulator back gate semiconductor-on-insulator wafer structure, wherein the first insulating layer comprises an upper insulating layer, the bonded second and third insulating layers together comprise a lower insulating layer, the hybrid semiconductor layer comprises a hybrid semiconductor-on-insulator layer having the first and second crystal orientation portions, the electrically conductive layer comprises a back gate layer, and the bulk substrate comprises a bulk substrate of the hybrid double buried insulator back gate semiconductor-on-insulator wafer structure.

8. The method of claim 7, wherein the first crystal orientation comprises a (100) crystal orientation and the second crystal orientation comprises a (110) crystal orientation.

9. The method of claim 7, wherein the first portion of the hybrid semiconductor-on-insulator layer comprises (100) silicon, and the second portion of the hybrid semiconductor-on-insulator layer comprises (110) silicon.

10. The structure of claim 7, wherein the first portion of the hybrid semiconductor-on-insulator layer comprises (100) silicon, and the second portion of the hybrid semiconductor-on-insulator layer comprises one of: (110) silicon germanium and (110) germanium.

11. The method of claim 7, wherein the sacrificial layer comprises silicon germanium, the first, second and third insulating layers comprise silicon based oxide layers, bulk substrate comprises silicon, and the hybrid semiconductor layer and hybrid bulk substrate comprise both (100) silicon and (110) silicon portions.

12. The method of claim 7, wherein the electrically conductive layer comprises one or more of: amorphous silicon, undoped polysilicon, doped polysilicon, metal, metal silicide, and metal nitride.

13. The method of claim 7, further comprising performing an annealing procedure to enhance bonding between the second and third insulating layers.

14. The method of claim 7, further comprising forming an etch stop layer between the first insulating layer and the electrically conductive layer.

15. The method of claim 7, further comprising:
   forming a hardmask layer over the hybrid double buried insulator back gate semiconductor-on-insulator wafer structure;
   patterning the hardmask layer and etching through the hybrid semiconductor-on-insulator layer so as to form shallow active area level STI recesses;
   forming a photoresist layer and lithographically patterning the photoresist layer to selectively expose part of one or more of the active area level STI recesses;
   etching through any remaining portion of the upper insulating layer and the back gate layer, thereby forming one or more deep back gate level STI recesses having portions thereof self-aligned to portions of one or more of the shallow active area level recesses; and
   filling both the shallow active area STI recesses and the self-aligned deep back gate level STI recesses with one or more insulating materials, and thereafter planarizing the one or more filled insulating materials;

wherein etching of the shallow active area level STI recesses stops on an etch stop layer included in the upper insulating layer, and etching of the deep back gate level STI recess stops on the lower insulating layer.

16. A method of forming a hybrid double buried oxide (BOX), back gate (DBBG) semiconductor-on-insulator (SOI) wafer structure for integrated circuit devices, the method comprising:

forming a first substrate portion, the first substrate portion further comprising a hybrid bulk silicon substrate having a (100) crystal orientation portion and a (110) crystal orientation portion, a sacrificial silicon germanium (SiGe) layer epitaxially grown on the hybrid bulk silicon substrate, a hybrid silicon layer grown on the sacrificial layer, the hybrid silicon layer also having a (100) crystal orientation portion and a (110) crystal orientation portion corresponding to the hybrid bulk silicon substrate, a first oxide layer thermally grown or deposited on the hybrid silicon layer, an etch stop layer deposited on the first oxide layer, an electrically conductive back gate layer formed on the etch stop layer, and a second oxide layer thermally grown or deposited on the back gate layer;

forming a second substrate portion having a bulk silicon substrate and a third oxide layer thermally grown or deposited on the second bulk substrate;

implanting a hydrogen species through the second oxide layer, the electrically conductive back gate layer, the etch stop layer, the first oxide layer and the silicon layer, stopping within or beyond the sacrificial SiGe layer;

bonding the second substrate portion to the first substrate portion so as to define a bonding interface between the second and third oxide layers;

performing a first annealing procedure to enhance oxide-to-oxide bonding between the second and third oxide layers;

performing a second annealing procedure at a higher temperature than the first annealing procedure so as to create a front of connecting voids corresponding to a location of the hydrogen species;

separating the bonded structure along the void front; and removing any remaining part of the hybrid bulk silicon substrate and the sacrificial SiGe layer on the hybrid silicon layer so as to define the hybrid DBBG SOI wafer structure, wherein the first oxide layer and the etch stop layer comprise an upper BOX, the bonded second and third oxide layers together comprise a lower BOX, the hybrid silicon layer comprises a hybrid SOI layer, the back gate layer is disposed between the upper BOX and the lower BOX, and the bulk silicon substrate comprises a bulk substrate of the hybrid DBBG SOI wafer structure.

17. The method of claim 16, further comprising performing a third annealing procedure at a higher temperature than the second annealing procedure to further enhance the oxide-to-oxide bonding between the second and third oxide layers.

18. The method of claim 16, further comprising:

forming a hardmask layer over the hybrid DBBG SOI wafer structure;

patterning the hardmask layer and etching through the hybrid SOI layer so as to form shallow active area level STI recesses;

forming a photoresist layer and lithographically patterning the photoresist layer to selectively expose part of one or more of the active area level STI recesses;

etching through any remaining portion of the upper BOX layer and the back gate layer, thereby forming one or more deep back gate level STI recesses having portions thereof self-aligned to portions of one or more of the shallow active area level recesses; and filling both the shallow active area STI recesses and the self-aligned deep back gate level STI recesses with one or more insulating materials, and thereafter planarizing the one or more filled insulating materials.

19. The method of claim 18, wherein etching of the shallow active area level STI recesses stops on the etch stop layer included in the upper BOX layer.

20. The method of claim 18, wherein etching of the deep back gate level STI recess stops on the lower BOX layer.

21. The method of claim 18, further comprising replacing (110) crystal orientation portions of the hybrid SOI layer with (110) crystal orientation portions of another semiconductor material.

22. The method of claim 21, wherein the another semiconductor material comprises one of silicon germanium and germanium.

23. The method of claim 21, wherein the replacing further comprises:

selectively epitaxially growing an initial (110) silicon germanium layer over (110) silicon portions of the hybrid SOI layer; and oxidizing the initial (110) silicon germanium layer so as to cause germanium atoms to be displaced from the initial (110) silicon germanium down into the (110) silicon portions of the hybrid SOI layer, thereby converting the (110) silicon portions of the hybrid SOI layer to (110) silicon germanium and converting the initial (110) silicon germanium layer to a final oxide of silicon layer.

24. The method of claim 23, further comprising removing the final oxide of silicon layer.

* * * * *